Dec. 20, 1955

S. LOEWE 2,728,066

TUNING CONTROL SYSTEM FOR WIRELESS SETS

Filed March 26, 1951

Inventor:
Siegmund Loewe 2,728,066

TUNING CONTROL SYSTEM FOR WIRELESS SETS

Siegmund Loewe, Yonkers, N. Y.

Application March 26, 1951, Serial No. 217,512
3 Claims. (Cl. 340—202)

Figure 1:
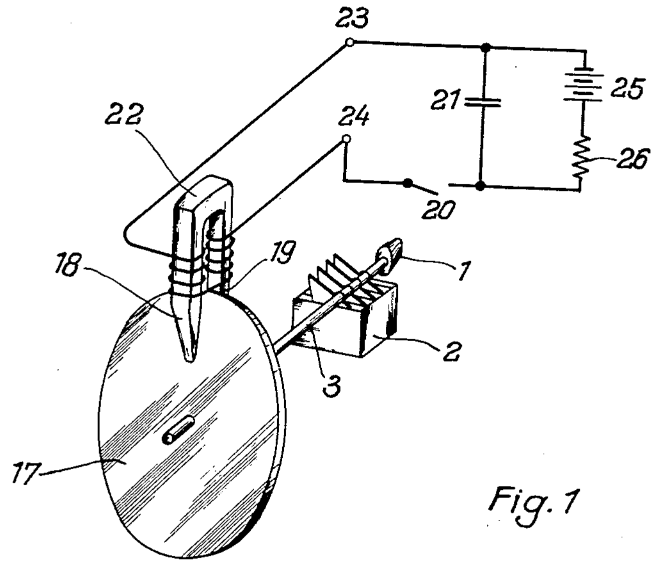

The present invention relates to tuning control mechanisms for wireless sets, in particular for broadcasting receivers.

It is the object of the present invention to enable the operator of the set quickly to recover and to tune-in any of the stations to be received, more particularly some of those stations which can be received very well or which the operator particularly likes to hear.

Arrangements of this nature are known in the prior art which work in such a way that the tuning control device of the wireless receiver is coupled with stop members by which the setting of the tuning member to the individual different transmitter stations is established, said stop members being supplied with notches engaging spring members.

The present invention discloses an arrangement which represents another advantageous solution of this problem, and which enables a rapid and at the same time sharp tuning of the receiver sets. It allows the automatic recovery of the correct setting of the tuning members to any desired station which has been precisely fixed. For this purpose, a magnetizable disc or another magnetogram (=magnetic record) carrier can be rigidly connected to the tuning member. On this disc or magnetogram carrier are arranged, in analogy with the mechanical marks described before, magnetic marks. If the marks on the disc, as the disc is moved, pass a locking magnet pole, a braking of the disc will occur, thus indicating exact tuning.

Devices for sharp tuning by means of braking magnet and braking disc have been known by the so-called "perceptible tuning control." Hereat, in dependence on electric auxiliary circuits in the intermediate frequency stage of the receiver, a relay circuit is switched on, which at sharp tuning supplies current to the braking magnet and, thereby, accomplishes a braking of the tuning shaft. This braking effect can be felt by the operator who, therefore, can exactly tune-in the receiver.

In contrary to that, this invention relates to a method quite different in principle which is simpler and does not depend on electric circuits of the receiver which are controlled by the transmitted oscillations. According to this invention, at a tuning control mechanism, in particular for broadcasting receivers, some tuning positions, which can be chosen at the operator's discretion, are preset by magnetizing a movable member (magnetogram carrier) which is positively connected with the tuning control mechanism. The movable member of preferably high coercive force which is to be magnetized consists of a steel disc, a steel tape or the like. The magnetic marks on this movable member (magnetogram carrier) accomplish the exact setting. This magnetizing device shall be employed as an aid for accomplishing the sharp and quick setting of the tuning control mechanism to the desired transmitter and, in case of need, the quick recovery of the transmitter. The member which, according to the invention, shall be magnetized, e. g. a steel disc, is coupled with the tuning member and follows the movement of the tuning device. It can be mounted, e. g. as a disc on the shaft of the tuning member.

Figure 2:
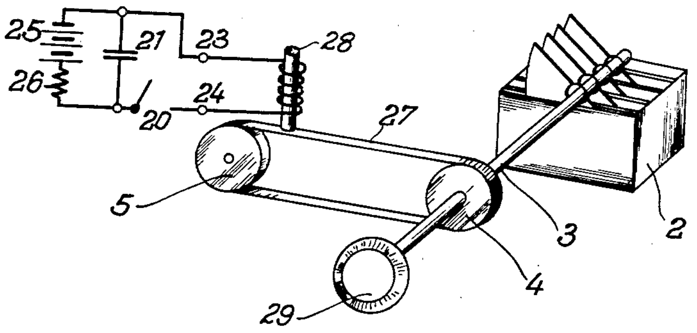

The present invention will be more clearly understood from the following detailed description and the accompanying drawing in which:

Figs. 1 and 2 show exemplary embodiments of the present inventive idea. Fig. 1 shows in perspective the use of a metallic disc as a magnetizable member. Fig. 2 shows the use of a magnetizable tape as a magnetizable member.

Referring to Fig. 1, 17 represents a steel disc which, in case of need, can be magnetized by the poles 18 and 19 of the electromagnet 22 by means of closing switch 20 and by the following discharge of condenser 21. Disc 17 is coupled with the tuning control mechanism and, in the simplest case, mounted on the shaft of the tuning member. Therefore at tuning-in it is moved together with the tuning members. If the operator of the receiver preferably wants to receive one single transmitter and, correspondingly, to be able quickly and sharply to tune-in this station, this setting of the tuning device is accomplished as follows. After correct tuning-in of the receiver to the desired transmitter, the non-magnetized steel disc is magnetized, by means of a short actuation of switch 20 and by the impulse of current thus generated in the magnet winding. This magnetization takes place at that spot of the disc which, during this setting operation, is situated between the poles 18 and 19 of the electromagnet 22. Consequently, the exact setting of the tuning control is fixed by a magnetized spot on the disc 17.

This preselecting operation, of course, can be accomplished for different tuning positions according to the number of transmitters preferred by the operator. If this magnetic fixation on the disc 17 has once been accomplished, the operator, in case of need, is able quickly to tune-in these settings fixed on disc 17 by the magnetic marks just mentioned. This tuning need not take place exactly because the sharp and exact tuning-in of the desired transmitter is accomplished by the disc itself, which now is automatically drawn by the magnet poles 18 and 19 into the position corresponding to the magnetic mark on the disc and to the desired transmitter. If this has been achieved, the sharp tuning-in of the desired transmitter has been accomplished, too.

Fig. 2 shows another embodiment of the present invention, wherein instead of a magnetizable disc 17 a magnetic tape 27 is used for fixing the various tuning positions of the tuning member 2 by means of the electromagnet 28. The elements of the circuit for energizing this magnet 28 are the same as in Fig. 1. The magnetizable tape 27 is mounted on pulleys 4 and 5. The latter is mounted on the shaft of the tuning member 2, which is adjustable by means of tuning knob 29. When the tuning member 2 is retuned to one of the tuning positions magnetically marked on the tape 27, the accurate sharp setting of the tuning member is accomplished by the electromagnet 28 which draws by cooperation with the correspondent magnetic mark the tape 27 into a position accurate at the pole of the magnet 28 correspondent with the sharp setting of the tuning member to the desired station to be received.

The electromagnets 22 and 28 are mounted in the receiver itself. As condenser 21 will be employed a condenser inside the receiver which is charged by a voltage source provided especially for this purpose or existent already for other purposes. Another solution consists in connecting the winding of the electromagnets to separate terminals 23 and 24 of the receiver. To these in case of need, is switched the corresponding circuit with switch 20 as well as the voltage source 25 and condenser 21 appertaining to it. 26 designates a regulating resistance in the energizing circuit for the electromagnets.

In the latter case, the magnetizing operation for establishing the magnetic marks can be accomplished preferably by the radio dealer if the operator himself does not have at his disposal a corresponding charging circuit. Of course, it is more recommendable to provide this charging circuit inside the receiver in order to enable the operator to accomplish the magnetic fixation of preferred tunings himself as may be required.

If these preferred transmitter stations should vary, e. g. owing to a change of residence, the disc must be demagnetized, for instance, by repeatedly rotating it with switch 20 in the "on position." Eventually, the demagnetizing of the disc can be accomplished, too, by means of a high frequency field as at the erasing of magnetic sound records.

The device proposed by this invention can just as well be employed in receivers fitted with a permeability tuning mechanism (with variable inductances). In this case, the magnetizable movable member must be positively or non-positively connected with the movable core of the tuning device.

What I claim is:

1. Tuning control system for wireless sets comprising a tuning member, a magnetizable member, an electromagnet and an electric energizing circuit for this electromagnet to produce magnetic marks on said magnetizable member, said tuning member being coupled with said magnetizable member, which thus is movable simultaneously with said tuning member, said magnetizable member being arranged rotatably between the poles of said electromagnet, said electric energizing circuit being adapted for energizing said electromagnet during the various tuning positions of said tuning member to magnetize said magnetizable member by means of the magnetic field of said electromagnet at those spots which are situated accurately at the poles of said electromagnet during the various tuning positions of said tuning member, thus fixing the various positions of said tuning member by the magnetic marks on said magnetizable member, said magnetic marks being adapted to draw the magnetizable member by cooperation with the poles of said electromagnet into a position accurate at the poles correspondent with the sharp setting of the tuning member to the desired position in case of the retuning of said tuning member to one of the tuning positions magnetically marked on said magnetizable member coupled with said tuning member.

2. Tuning control system as claimed in claim 1, wherein the magnetizable member consists of a ferromagnetic disc mounted on the shaft of the tuning member.

3. Tuning control system as claimed in claim 1, wherein the magnetizable member consists of a magnetizable tape arranged to be rotatable with the tuning member passing the poles of the electromagnet.

References Cited in the file of this patent

UNITED STATES PATENTS

| | | |
|---|---|---|
| 1,603,646 | Sperry, Jr. | Oct. 19, 1926 |
| 1,964,449 | Carlson | June 26, 1934 |
| 2,270,772 | Schröder | Jan. 20, 1942 |
| 2,418,136 | Munson, et al. | Apr. 1, 1947 |
| 2,573,291 | Wagenknecht | Oct. 30, 1951 |